(12) United States Patent
Gorczyca

(10) Patent No.: US 6,800,373 B2
(45) Date of Patent: Oct. 5, 2004

(54) EPOXY RESIN COMPOSITIONS, SOLID STATE DEVICES ENCAPSULATED THEREWITH AND METHOD

(75) Inventor: Thomas Bert Gorczyca, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 14 days.

(21) Appl. No.: 10/265,422

(22) Filed: Oct. 7, 2002

(65) Prior Publication Data

US 2004/0067366 A1 Apr. 8, 2004

(51) Int. Cl.$^7$ ................................................. B32B 9/04
(52) U.S. Cl. ..................... 428/447; 428/413; 257/687; 257/701; 438/126; 438/127; 523/435; 524/261; 524/268
(58) Field of Search ............................. 428/413, 447; 523/435, 400; 524/261, 268; 257/676, 687, 701, 678, 707, 787, 791, 793; 438/106, 121, 125, 126, 127; 525/476

(56) References Cited

U.S. PATENT DOCUMENTS

| 5,855,994 | A | | 1/1999 | Biebuyck et al. | |
|---|---|---|---|---|---|
| 6,083,774 | A | * | 7/2000 | Shiobara et al. | ............ 438/108 |
| 6,204,523 | B1 | | 3/2001 | Carey et al. | |
| 6,506,822 | B2 | * | 1/2003 | Ichiroku et al. | ............ 523/435 |
| 6,624,216 | B2 | * | 9/2003 | Morganelli et al. | ......... 523/435 |
| 2003/0171468 | A1 | * | 9/2003 | Nishimura et al. | ......... 524/261 |

* cited by examiner

Primary Examiner—David J. Buttner
Assistant Examiner—Christopher Keehan
(74) Attorney, Agent, or Firm—Kimberly H. Parker; Patrick K. Patnode

(57) ABSTRACT

Epoxy resin compositions are disclosed which comprise (A) at least one silicone resin, (B) at least one epoxy resin, (C) at least one anhydride curing agent, (D) at least one siloxane surfactant, and (E) at least one ancillary curing catalyst. Also disclosed are a packaged solid state devices comprising a package, a chip, and an encapsulant comprising a composition of the invention. A method of encapsulating a solid state device is also provided.

66 Claims, 5 Drawing Sheets

EPOXY RESIN COMPOSITIONS, SOLID STATE DEVICES ENCAPSULATED THEREWITH AND METHOD

BACKGROUND OF THE INVENTION

This invention relates to epoxy resin compositions and solid state devices encapsulated therewith. The invention also relates to a method for encapsulating a solid state device.

Solid state devices, sometimes referred to as semiconductor devices or opto-electronic devices, comprise light emitting diodes (LEDs), charge coupled devices (CCDs), large scale integrations (LSIs), photodiodes, vertical cavity surface emitting lasers (VCSELs), phototransistors, photocouplers, opto-electronic couplers and the like. Such devices often exhibit special packaging needs. High-efficiency, high lumen, solid-state white LEDs require a novel packaging material which can withstand more demanding conditions than those required by typical low-intensity, longer wavelength LEDs. Common packaging materials will often undergo a gradual loss of optical and mechanical properties due to the combination of thermal, oxidative and photodegradation processes.

There is thus a continuing need for novel packaging material for solid state devices, such packaging material desirably possessing properties such as high transmission in a range from near UV to the visible wavelength, long-term thermal stability, oxidative stability, UV stability, thermal compliance, moisture resistance, transparency, crack resistance, polishability characteristics, compatibility with other materials used to envelope the solid state device with low color, and high reflective index.

SUMMARY OF INVENTION

The present inventors have discovered curable resin compositions ideally suited for an encapsulation of solid state devices such as light emitting diodes. In one embodiment, the present invention relates to a curable epoxy resin composition for encapsulation of a solid state device, which comprises (A) at least one silicone resin, (B) at least one epoxy resin, (C) at least one anhydride curing agent, (D) at least one siloxane surfactant, and (E) it least one ancillary curing catalyst.

In another embodiment of the present invention, there is provided a packaged solid state device comprising: (a) a package; (b) a chip; and (c) an encapsulant comprising: (A) at least one silicone resin, (B) at least one epoxy resin, (C) at least one anhydride curing agent, (D) at least one siloxane surfactant, and (E) at least one ancillary curing catalyst.

In another embodiment of the present invention, there is provided a method of encapsulating a solid state device comprising placing the solid state device into an encapsulating composition comprising (A) at least one silicone resin, (B) at least one epoxy resin, (C) at least one anhydride curing agent, (D) at least one siloxane surfactant, and (E) at least one ancillary curing catalyst.

Various other features, aspects, and advantages of the present invention will become more apparent with reference to the following description and appended claims.

DETAILED DESCRIPTION

Figure 1:
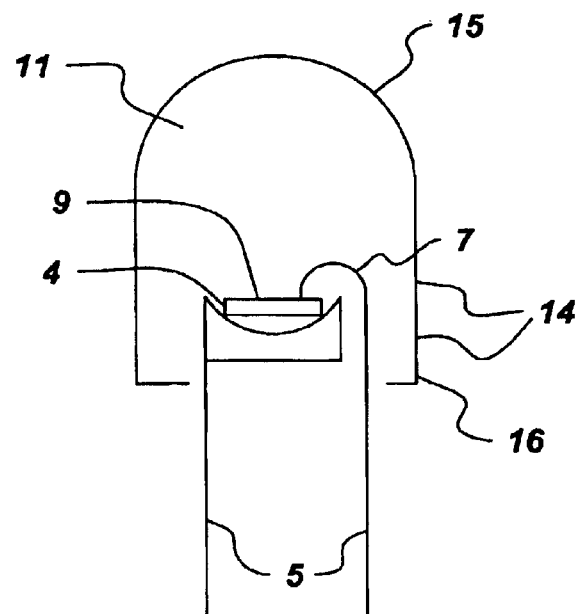
FIG. 1 shows a schematic diagram of an LED device.

The inventors of the present invention have determined that by using siloxane surfactants it is possible to compatibilize silicone resins with epoxy resins to make an encapsulant for a solid state device which has clarity, optimum glass transition characteristics, desirable thermal expansion characteristics, moisture resistance, refractive index values as well as transmission characteristics at particular wavelengths. The encapsulant composition comprises (A) at least one silicone resin, (B) at least one epoxy resin, (C) at least one anhydride curing agent, (D) at least one siloxane surfactant, and (E) at least one ancillary curing catalyst. Coatings using these encapsulant compositions provide moisture penetration resistance as well as heat resistance. The obtained composition may also be used as adhesives and dielectrics for multichip module fabrication. The adhesive is used for attaching chips onto a substrate or flex, as an adhesive for laminating a dielectric film such as Kapton, and as a dielectric or top layer providing a moisture resistant and abrasion resistant protection layer. The obtained formulations may also be used as encapsulants for embedding devices in multichip module fabrication.

Silicone resins useful as component (A) in the present invention comprise those given in structure (I) below.

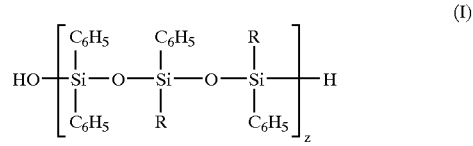

In some embodiments silicone resins comprise the silicon resin of structure (I) where z is typically in a range between about 1 and about 10, and more typically, in a range between about 2 and about 5; R is selected from hydroxyl, $C_{1-22}$ alkyl, $C_{1-22}$ alkoxy, $C_{2-22}$ alkenyl, $C_{6-14}$ aryl, $C_{6-22}$ alkyl-substituted aryl, and $C_{6-22}$ aralkyl. Additionally, the silicone resin can be a branched structure in which R may be an $OSiR^3$ substituent, where $R^3$ can be hydroxyl, $C_{1-22}$ alkyl, $C_{1-22}$ alkoxy, $C_{2-22}$ alkenyl, $C_{6-14}$ aryl, $C_{6-22}$ alkyl-substituted aryl, and $C_{6-22}$ aralkyl.

Epoxy resins (B) useful in the encapsulant of present invention include those described in "Chemistry and Technology of the Epoxy Resins," B. Ellis (Ed.) Chapman Hall 1993, New York and "Epoxy Resins Chemistry and Technology," C. May and Y. Tanaka, Marcell Dekker 1972, New York. Epoxy resins that can be used for the present invention include those that could be produced by reacting a hydroxyl, carboxyl, or amine-containing compound with epichlorobydrin, preferably in the presence of a basic catalyst such as a metal hydroxide, for example, sodium hydroxide. Also included are epoxy resins produced by reaction of a compound containing at least one and preferably two or more carbon-carbon double bond with a peroxide, for example, a peroxyacid. Examples of epoxy resins useful in the present invention include aliphatic epoxy resins, cycloaliphatic epoxy resins, bisphenol-A epoxy resins, bisphenol-F epoxy resins, phenol novolac epoxy resins, cresol-novolac epoxy resins, biphenyl epoxy resins, biphenyl epoxy resins, 4,4'-biphenyl epoxy resins, polyfunctional epoxy resins, divinylbenzene dioxide, and 2-glycidylphenylglycidyl ether. These epoxy resins can be used singly or in a combination of at least two epoxy resins. Preferred epoxy resins for the present invention are cycloaliphatic epoxy resins and aliphatic epoxy resins. Aliphatic epoxy resins include compounds that contain at least one aliphatic group and at least one epoxy group. Examples of aliphatic epoxies include, butadiene dioxide, dimethylpentane dioxide, diglycidyl ether, 1,4-butanedioldiglycidyl ether, diethylene, glycol diglycidyl ether, and dipentene dioxide.

Cycloaliphatic epoxy resins are compounds that contain at least about one cycloaliphatic group and at least one oxirane group. For example, cycloalipahtic epoxies may contain one cycloaliphatic group and at least two oxirane rings per molecule. Specific examples include 2-(3,4-epoxy)cyclohexyl-5,5-spiro-(3,4-epoxy)cyclohexane-m-dioxane, 3,4-epoxycyclohexylalkyl-3,4-epoxycyclohexanecarboxylate, 3,4-epoxy-6-methylcyclohexylmethyl-3,4-epoxy-6-methylcyclohexanecarboxylate, vinyl cyclohexanedioxide, bis(3,4-epoxycyclohexylmethyl)adipate, bis(3,4-epoxy-6-methyl cyclohexylmethyl)adipate, exo-exo bis(2,3-epoxycyclopentyl) ether, endo-exo bis(2,3-epoxycyclopentyl) ether, 2,2-bis(4-(2,3-epoxypropoxy)cyclohexyl)propane, 2,6-bis(2,3-epoxy,propoxycyclohexyl-p-dioxane), 2,6-bis(2,3-epoxypropoxy)norbonene, the diglycidylether of linoleic acid dimer, limonene dioxide, 2,2-bis(3,4-epoxycyclohexyl)propane, dicyclopentadiene dioxide, 1,2-epoxy-6-(2,3-epoxypropoxy)hexahydro-4,7-methanoindane, p-(2,3-epoxy)cyclopentylphenyl-2,3-epoxypropylether, 1-(2,3-epoxypropoxy)phenyl-5,6-epoxyhexahydro-4,7-methanoindane, o-(2,3-epoxy)cyclopentylphenyl-2,3-epoxypropyl ether), 1,2-bis[5-(1,2-epoxy)-4,7-hexahydromethanoindanoxyl]ethane, cyclopentenylphenyl glycidyl ether, cyclohexanediol diglycidyl ether, and diglycidyl hexahydrophthalate.

Additional exemplary epoxy resins (B) of the present invention include those of structure (II), (III), (IV), and (V) given below.

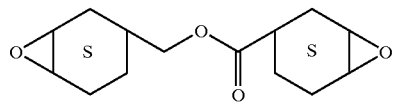

(II)

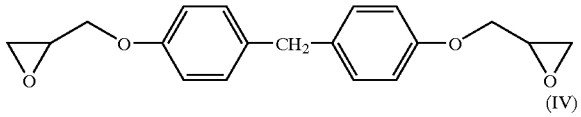

(III)

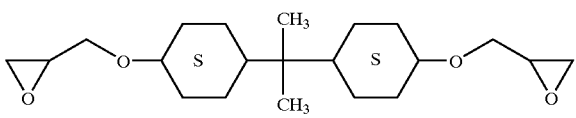

(IV)

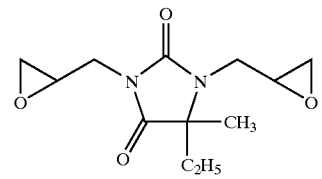

(V)

Additives such as thermal stabilizers or antioxidants maybe used with aromatic epoxy resins to lessen discoloring. Flexibilizers are useful in the composition to reduce brittleness and include aliphatic epoxy resins, siloxane resins, and the like.

Exemplary anhydride curing agents useful as component (C) typically include those of structures (VI) and (VII) below

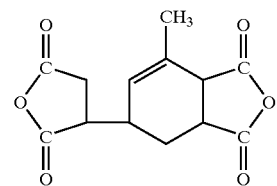

(VI)

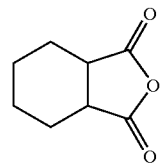

(VII)

and bicyclo[2.2.1]hept-5-ene-2,3-dicarboxylic anhydride, methylbicyclo[2.2.1]hept-5-ene-2,3-dicarboxylic anhydride, bicyclo[2.2.1]hept-5-ene-2,3-dicarboxylic anhydride, phthalic anhydride, pyromellitic dianhydride, hexahydrophthalic anhydride, hexahydro-4-methylphthalic anhydride, dodecenylsuccinic anhydride, dichloromaleic anhydride, chlorendic anhydride, tetrachlorophthalic anhydride, and the like. Mixtures comprising at least two anhydride curing agents may also be used. Illustrative examples are described in "Chemistry and Technology of the Epoxy Resins" B. Ellis (Ed.) Chapman Hall, New York, 1993 and in "Epoxy Resins Chemistry and Technology", edited by C. A. May, Marcel Dekker, New York, 2nd edition, 1988.

The inventors have found that by using siloxane surfactants (D) it is possible to blend various components in the encapsulating composition resulting in homogeneity, clarity, low scattering properties, moisture resistance, and flexibility in addition to making the composition shatter proof. Siloxane surfactants are used to compatibilize the various materials used in the present invention. Siloxane surfactants may be used to compatibilize incompatible material into one homogeneous phase (i.e. uniform phase) by a reduction of interfacial tension to give desirable and required properties. For example, the silicone resin may he compatibilized with the epoxy resin using the siloxane surfactant. The siloxane surfactants used in the present invention may be functionalized with polyethylene glycol, polypropylene glycol, polypropylene glycol ethers and substituted siloxane polymers. The surfactants may be used singly or in combination thereof. The siloxane surfactants of the present invention may be used to compatibilize the silicone resin with the epoxy resin, curing agents, and optional refractive index modifiers and thermal stabilizers into one homogeneous composition which, when cured may give an encapsulant composition which may be clear and transparent with moisture resistance, solvent resistance, crack resistance properties, heat resistance, as well as UV absorption and light transmission in given wavelength ranges. The siloxane surfactant used in the present invention may be of the general structure (VIII)

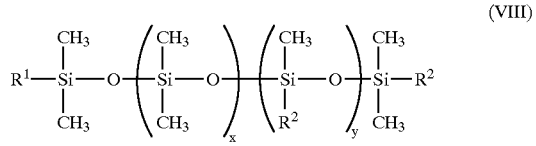

(VIII)

wherein $R^1$ and $R^2$ are independently at each occurrence selected from ethylene oxide, propylene oxide and methylene. In one embodiment of the present invention, R1 may be ethylene oxide while $R^2$ may be a methyl group. In another embodiment, $R^1$ may be a methyl group while $R^2$ may be an ethylene oxide group. In a third embodiment, $R^1$ may be a methyl group while $R^2$ may be a mixture of ethylene oxide and propylene oxide groups. The values of x and y in structure (VIII) may be in a range between about 0 and about 20 in one embodiment while it may be in a range between about 3 to about 15 in another embodiment of the present invention. In a third embodiment of the present invention, the values of x and y in structure (VIII) may be in a range between about 5 to about 10. The percentage of silicon in the surfactant typically may be in a range between about 10% by weight and about 80% by weight of the total weight of the siloxane surfactant in one embodiment of the present invention, while it may be in a range between about 20% by weight and about 60% by weight of the total weight of the siloxane surfactant in a second embodiment of the invention. In a third embodiment, the silicon content may be in a range between about 25% and about 50% by weight of the total weight of the siloxane surfactant. The siloxane surfactant used in the present invention may have viscosities in a range between about 10 centistokes (cst) and about 2000 centistokes (cst) in one embodiment while it may have viscosities in a range between about 100 cst and about 1000 cst in a second embodiment and in a range between about 300 cst and about 600 cst in a third embodiment of the present invention. When present, the molecular weight of the polyether in the siloxane surfactant is typically in a range between about 100 and about 2000 in one embodiment of the present invention while it may be in a range between about 200 and about 1500 in a second embodiment and in a range between about 500 and about 1000 in a third embodiment of the present invention. In another embodiment, a siloxane surfactant that may be used in compatibilizing the silicone resin and the epoxy resin is given in structure (IX) given below.

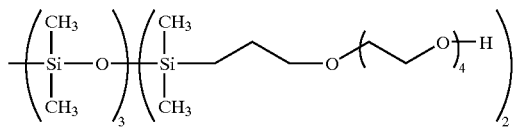

(IX)

Illustrative examples of ancillary curing catalysts (E) are described in "Chemistry and Technology of the Epoxy Resins" edited by B. Ellis, Chapman Hall, N.Y., 1993, and in "Epoxy Resins Chemistry and Technology", edited by C. A. May, Marcel Dekker, N.Y., 2nd edition, 1988. In various embodiments, the ancillary curing catalyst comprises an organometallic salt, a sulfonium salt or an iodonium salt. In particular embodiments, the ancillary curing catalyst comprises at least one of a metal carboxylate, a metal acetylacetonate, zinc octoate, stannous octoate, triarylsulfonium hexafluorophosphate, triarylsulfonium hexafluoroantimonate (such as CD 1010 sold by Sartomer Corporation), diaryliodonium hexafluoroantimonate, or diaryliodonium tetrakis(pentafluorophenyl)borate. These compounds can be used singly or in a combination of at least two compounds.

The amounts of silicone resin (A), epoxy resin (B), anhydride curing agent (C), siloxane surfactant (D), and ancillary curing catalyst (E) can be varied over a wide range. In various embodiments, the amount of silicone resin (A) in the composition is greater than about 40% by weight based on the combined weight of the silicone resin (A), epoxy resin (B), anhydride curing gent (C), siloxane surfactant (D), and ancillary curing catalyst (E). In some embodiments, the amount of silicone resin (A) in the composition is in a range of between about 40% by weight and about 99% by weight based on the combined weight of silicone resin (A), epoxy resin (B), anhydride curing agent (C), siloxane surfactant (D), and ancillary curing catalyst (E). In other embodiments, the amount of silicone resin (A) in the composition is in a range of between about 76% by weight and about 99% by weight based on the combined weight of silicone resin (A), epoxy resin (B), anhydride curing agent (C), siloxane surfactant (D), and ancillary curing catalyst (E). When the silicone resin, epoxy resin, the siloxane surfactant, the anhydride curing agent, and the ancillary curing catalyst are mixed in to give an encapsulating composition and the composition is cured and polished, the resulting surface may be transparent and clear and the encapsulant material may be crack-proof and may not scatter light.

In various embodiments of the present invention, the amount of anhydride curing agent (C), in the composition is less than about 40% by weight based on the combined weight of silicone resin (A), epoxy resin (B), anhydride curing agent (C), siloxane surfactant (D), and ancillary curing catalyst (E). In other embodiments, the amount of curing agent (C) in the composition is less than about 25% by weight based on the combined weight of silicone resin (A), epoxy resin (B), anhydride curing agent (C), siloxane surfactant (D), and ancillary curing catalyst (E). In some embodiments, the amount of anhydride curing agent (C) in the composition is in a range of between about 1% by weight and about 24% by weight based on the combined weight of silicone resin (A), epoxy resin (B), anhydride curing agent (C) siloxane surfactant (D), and ancillary curing catalyst (E). In other embodiments, the amount of anhydride curing agent (C) in the composition is in a range of between about 1% by weight and about 20% by weight based on the combined weight of silicone resin (A), epoxy resin (B), anhydride curing agent (C), siloxane surfactant (D), and ancillary curing catalyst (E).

In various embodiments, the amount of ancillary curing catalyst (E) in the composition is less than about 10% by weight based on the combined weight of silicone resin (A), epoxy resin (B), anhydride curing agent (C), siloxane surfactant (D) and ancillary curing catalyst (E). In some embodiments, the amount of ancillary curing catalyst (E) in the composition is in a range between about 0.008% by weight and about 10% by weight based on the combined weight of silicone resin (A), epoxy resin (B), anhydride curing agent (C), siloxane surfactant (D), and ancillary curing catalyst (E). In other embodiments, the amount of ancillary curing catalyst (E) in the composition is in a range between about 0.01% by weight and about 5% by weight based on the combined weight of silicone resin (A), epoxy resin (B), anhydride curing agent (C), siloxane surfactant (D), and ancillary curing catalyst (E). In some embodiments the amount of ancillary curing catalyst (E) in the composition is in a range between about 0.01% by weight and about 1.0% by weight based on the combined weight of silicone resin (A), epoxy resin (B), anhydride curing agent (C), siloxane surfactant (D), and ancillary curing catalyst (E). In other embodiments the amount of ancillary curing catalyst (E) in the composition is in a range between about 0.01% by weight and about 0.5% by weight based on the combined weight of silicone resin (A), epoxy resin (B), anhydride curing agent (C), siloxane surfactant (D) and ancillary curing catalyst (E).

One or more thermal stabilizers, UV-stabilizers or mixtures thereof may optionally be present in the compositions of the invention. Such stabilizers may reduce color formation during processing of the encapsulant. Examples of stabilizers are described in J. F. Rabek, "Photostabilization of Polymers; Principles and Applications", Elsevier Applied Science, N.Y., 1990 and in "Plastics Additives Handbook", 5th edition, edited by H. Zweifel, Hanser Publishers, 2001. Illustrative examples of suitable stabilizers comprise organic phosphites and phosphonites, such as triphenyl phosphite, diphenylalkyl phosphites, phenyldialkyl phosphites, tri-(nonylphenyl) phosphite, trilauryl phosphite, trioctadecyl phosphite, di-stearyl-pentaerythritol diphosphite, tris-(2,4-di-tert-butylphenyl) phosphite, di-isodecylpentaerythritol diphosphite, di-(2,4-di-tert-butylphenyl) pentaerythritol diphosphite, tristearyl-sorbitol triphosphite, and tetrakis-(2,4-di-tert-butylphenyl)-4,4'-biphenyldiphosphonite. Illustrative examples of suitable stabilizers also comprise sulfur-containing phosphorus compounds such as trismethylthiophosphite, trisethylthiophosphite, trispropylthiophosphite, trispentylthiophosphite, trishexylthiophosphite, trisheptylthiophosphite, trisoctylthiophosphite, trisnonylthiophosphite, trislaurylthiophosphite, trisphenylthiophosphite, trisbenzylthiophosphite, bispropiothiomethylphosphite, bispropiothiononylphosphite, bisnonylthiomethylphosphite, bisnonylthiobutylphosphite, methylethylthiobutylphosphite, methylethylthiopropiophosphite, methylnonylthiobutylphosphite, methylnonylthiolaurylphosphite, and pentylnonylthiolaurylphosphite. These compounds can be used singly or in a combination of at least two compounds.

Suitable stabilizers also comprise sterically hindered phenols. Illustrative examples of sterically hindered phenol stabilizers comprise 2-tertiary-alkyl-substituted phenol derivatives, 2-tertiary-amyl-substituted phenol derivatives, 2-tertiary-octyl-substituted phenol derivatives, 2-tertiary-butyl-substituted phenol derivatives, 2,6-di-tertiary-butyl-substituted phenol derivatives, 2-tertiary-butyl-6-methyl-(or 6-methylene-) substituted phenol derivatives, and 2,6-di-methyl-substituted phenol derivatives. These compounds can be used singly or in a combination of at least two compounds. In certain particular embodiments of the present invention, sterically hindered phenol stabilizers comprise alpha-tocopherol and butylated hydroxy toluene.

Suitable stabilizers also comprise sterically hindered amines, illustrative examples of which comprise bis-(2,2,6,6-tetramethylpiperidyl) sebacate, bis-(1,2,2,6,6-pentamethylpiperidyl) sebacate, n-butyl-3,5-di-tert-butyl-4-hydroxybenzyl malonic acid bis-(1,2,2,6,6-pentamethylpiperidyl)ester, condensation product of 1-hydroxyethyl-2,2,6,6-tetramethyl-4-hydroxypiperidine and succinic acid, condensation product of N,N'-(2,2,6,6-tetramethylpiperidyl)-hexamethylenediamine and 4-tert-octyl-amino-2,6-dichloro-s-triazine, tris-(2,2,6,6-tetramethylpiperidyl)-nitrilotriacetate, tetrakis-(2,2,6,6-tetramethyl-4-piperidyl)-1,2,3,4-butanetetracarboxylate, and 1,1'-(1,2-ethanediyl)-bis-(3,3,5,5-tetramethylpiperazinone). These compounds can be used singly or in a combination of at least two compounds.

Suitable stabilizers also comprise compounds which destroy peroxide, illustrative examples of which comprise esters of beta-thiodipropionic acid, for example the lauryl, stearyl, myristyl or tridecyl esters; mercaptobenzimidazole or the zinc salt of 2-mercaptobenzimidazole; zinc dibutyl-dithiocarbamate; dioctadecyl disulfide; and pentaerythritol tetrakis-(beta-dodecylmercapto)-propionate. These compounds can be used singly or in a combination of at least two compounds.

Optional components in the present invention also comprise cure modifiers which may modify the rate of cure of epoxy resin. In various embodiments of the present invention, cure modifiers comprise at least one cure accelerators or cure inhibitors. Cure modifiers may comprise compounds containing heteroatoms that possess lone electron pairs. Phosphites may be used as cure modifiers. Illustrative examples of phosphites comprise trialkylphosphites, triarylphosphites, trialkylthiophosphites, and triarylthiophosphites. In some embodiments of the present invention, phosphites comprise triphenyl phosphite, benzyldiethyl phosphite, or tributyl phosphite. Other suitable cure modifiers comprise sterically hindered amines and 2,2,6,6-tetramethylpiperidyl residues, such as for example bis(2,2,6,6-tetramethylpiperidyl) sebacate. Mixtures of cure modifiers may also be employed.

Optional components in the present invention also comprise coupling agents which in various embodiments may help epoxy resin bind to a matrix, such as a glass matrix, so as to form a strong bond to the surface such that premature failure does not occur. Coupling agents comprise compounds that contain both silane and mercapto moieties, illustrative examples of which comprise mercaptomethyltriphenylsilane, beta-mercaptoethyltriphenylsilane, beta-mercaptopropyltriphenylsilane, gamma-mercaptopropyldiphenylmethylsilane, gamma-mercaptopropylphenyldimethylsilane, delta-mercaptobutylphenyldimethylsilane, delta-mercaptobutyltriphenylsilane, tris(beta-mercaptoethyl) phenylsilane, tris(gamma-mercaptopropyl)phenylsilane, tris (gamma-mercaptopropyl)methylsilane, tris(gamma-mercaptopropyl)ethylsilane, and tris(gamma-mercaptopropyl)benzylsilane. Coupling agents also comprise compounds which comprise both an alkoxysilane and an organic moiety, illustrative examples of which comprise compounds of the formula $(R^5O)_3Si-R^6$ wherein $R^5$ is an alkyl group and $R^6$ is selected from the group consisting of vinyl, 3-glycidoxypropyl, 3-mercaptopropyl, 3-acryloxypropyl, 3-methacryloxypropyl, and $C_nH_{2n+1}$ wherein n has a value in a range between about 4 and about 16. In some embodiments of the present invention, $R^5$ is methyl or ethyl. In other embodiments of the present invention, coupling agents comprise compounds that contain both an alkoxysilane and an epoxy moiety. Coupling agents can be used singly or in a combination of at least two compounds.

Optional components in the present invention also comprise refractive index modifiers. As light passes from the relatively high index of diffraction chip (typically in a range between about 2.8 and 3.2) to the lower refractive index epoxy encapsulant (typically in a range between about 1.2 and about 1.6) some of the light is reflected back to the chip at the critical angle. Modifiers with high refractive index added to the epoxy increase its refractive index, producing a better match of the two refractive indices and an increase in the amount of emitted light. Such materials increase the refractive index of the epoxy without significantly affecting the transparency of the epoxy encapsulant. Modifiers of this type comprise additives with high refractive index. These materials comprise optically transparent organics or inorganics such as silicone fluids, and agglomerates of particles or structures whose size is less than the size of the wavelength of the emitted light. Such agglomerates are sometimes referred to as nanoparticles. Examples of agglomerates comprise a variety of transparent metal oxides or Group II-VI materials that are relatively free from scattering. In one embodiment, a nanoparticle material is titanium dioxide. In other embodiments, other types of transparent metal oxides or combinations of metal oxides can be used. For example, magnesium oxide, yttria, zirconia, cerium oxides, alumina, lead oxides, and composite materials such as those comprising yttria and zirconia can be used to produce nanoparticles. In other embodiments, nanoparticles are made from one of the Group II-VI materials comprising zinc selenide, zinc sulphide, and alloys made from Zn, Se, S, and Te. Alternatively, gallium nitride, silicon nitride, or aluminum nitride can be also used to make nanoparticles. Refractive index modifiers can be used singly or in a combination of at least two compounds. In one embodiment of the present invention, the refractive index of the encapsulating composition is in a range between about 0.1 and about 10.0. In a second embodiment, the refractive index is in a range between about 0.5 and about 5.0 and in a third embodiment, the refractive index is in a range between about 1.0 and about 2.5. In many embodiments, the refractive index is in a range between about 1.0 and about 2.0.

The compositions of the present invention can be prepared by combining the various components, including optional components, in any convenient order. In various embodiments, all the components may be mixed together. In other embodiments, two or more components may be premixed and then subsequently combined with other components. In one embodiment, the components of the compositions of the present invention comprise a two-part composition, wherein the various components are premixed in at least two separate compositions before combination to provide a final composition.

Encapsulation techniques for solid-state devices comprise casting, resin transfer molding and the like. After the solid-state device is enveloped in the uncured resin, typically performed in a mold, the resin is cured. These resins may be cured in one or more stages using methods such as thermal, UV, electron beam techniques, or combinations thereof. For example, thermal cure may be performed at temperatures in one embodiment in a range of between 20° C. and about 200° C., in another embodiment in a range between about 80° C. and about 200° C., in another embodiment in a range between about 100° C. and about 200° C., and in another embodiment in a range between about 120° C. and about 160° C. Also in other embodiments these materials can be photo-chemically cured, initially at about room temperature. Although some thermal excursion from the photochemical reaction and subsequent cure can occur, no external heating is typically required. In other embodiments, these materials may be cured in two stages wherein an initial thermal or UV cure, for example, may be used to produce a partially hardened or B-staged epoxy resin. This material, which is easily handled, may then be further cured using, for example, either thermal or UV techniques, to produce a material with the desired thermal performance (for example glass transition temperature (Tg) and coefficient of thermal expansion (CTE)), optical properties and moisture resistance required for encapsulated solid state devices.

When the silicone resin (A), the epoxy resin (B), the siloxane surfactant (D), the anhydride curing agent (C) and the ancillary curing catalyst (E) are mixed and cured to give the encapsulating material, the coefficient of thermal expansion measured above the glass transition temperature varies in a range between about 10 and about 100 in one embodiment of the present invention, in a range between about 50 and about 90 in a second embodiment of the present invention, and in a range between about 60 and about 85 in a third embodiment of the present invention. The coefficient of thermal expansion when measured below the glass transition temperature varies in a range between about 50 and about 300 in one embodiment of the present invention while in a second embodiment the coefficient of thermal expansion varies in a range between about 100 and about 275 and in a third embodiment the coefficient of thermal expansion varies in a range between about 150 and about 250.

The silicone resin (A), the epoxy resin (B), the siloxane surfactant (D), the anhydride curing agent (C), and the ancillary curing catalyst (E) when mixed into an encapsulating composition may give desirable glass transition values. In one embodiment the glass transition temperature of the composition is in a range between about 10° C. and about 250° C. while in a second embodiment the glass transition is in a range between about 20° C. and about 200° C. In a third embodiment, the glass transition of the encapsulating composition varies in a range between about 24° C. and about 150° C.

The epoxy resin compositions of the present invention can be used in applications known for epoxy resin compositions. Such applications comprise coatings, potting compounds, and encapsulants for solid-state devices. In one embodiment, a solid-state device is a LED 1. FIG. 1 schematically illustrates a LED 1 according to one embodiment of the present invention. The LED 1 contains a LED chip 4, which is electrically connected to a lead frame 5. For example, the LED chip 4 may be directly electrically connected to an anode or cathode electrode of the lead frame 5 and connected by a lead 7 to the opposite cathode or anode electrode of the lead frame 5, as illustrated in FIG. 1. In a particular embodiment illustrated in FIG. 1, the lead frame 5 supports the LED chip 4. However, the lead 7 may be omitted, and the LED chip 4 may straddle both electrodes of the lead frame 5 with the bottom of the LED chip 4 containing the contact layers, which contact both the anode and cathode electrode of the lead frame 5. The lead frame 5 connects to a power supply, such as a current or voltage source or to another circuit (not shown).

The LED chip 4 emits radiation from the radiation emitting surface 9. The LED 1 may emit visible, ultraviolet or infrared radiation. The LED chip 4 may comprise any LED chip 4 containing a p-n junction of any semiconductor layers capable of emitting the desired radiation. For example, the LED chip 4 may contain any desired Group III-V compound semiconductor layers, such as GaAs, GaAlAs, GaN, InGaN, GaP, etc., or Group II-VI compound semiconductor layers such ZnSe, ZnSSe, CdTe, etc., or Group IV-IV semiconductor layers, such as SiC. The LED chip 4 may also contain other layers, such as cladding layers, waveguide layers and contact layers.

The LED 1 is packaged with an encapsulant 11 of the present invention. An alternative term for encapsulant is encapsulating material. In one embodiment, the LED packaging includes encapsulant 11 located in a package, such as a shell 14. The shell 14 may be any plastic or other material, such as polycarbonate, which is transparent to the LED radiation. However, the shell 14 may be omitted to simplify processing if encapsulant 11 has sufficient toughness and rigidity to be used without a shell 14. Thus, the outer surface of encapsulant 11 would act in some embodiments as a shell 14 or package. The shell 14 contains a light or radiation emitting surface 15 above the LED chip 4 and a non-emitting surface 16 adjacent to the lead frame 5. The radiation emitting surface 15 may be curved to act as a lens and/or may be colored to act as a filter. In various embodiments the non-emitting surface 16 may be opaque to the LED radiation, and may be made of opaque materials such as metal. The shell 14 may also contain a reflector around the LED chip 4, or other components, such as resistors, etc., if desired.

In other embodiments, encapsulating materials may optionally contain a phosphor to optimize the color output of the LED 1. For example, a phosphor may be interspersed or mixed as a phosphor powder with encapsulant 11 or coated as a thin film on the LED chip 4 or coated on the inner surface of the shell 14. Any phosphor material may be used with the LED chip. For example, a yellow emitting cerium doped yttrium aluminum garnet phosphor (YAG:$Ce^{3+}$) may be used with a blue emitting InGaN active layer LED chip to produce a visible yellow and blue light output which appears white to a human observer. Other combinations of LED chips and phosphors may be used as desired.

While the packaged LED chip 4 is supported by the lead frame 5 according to one embodiment as illustrated in FIG. 1, the LED 1 can have various other structures. For example, the LED chip 4 may be supported by the bottom surface 16 of the shell 14 or by a pedestal (not shown) located on the bottom of the shell 14 instead of by the lead frame 5.

Figure 2:
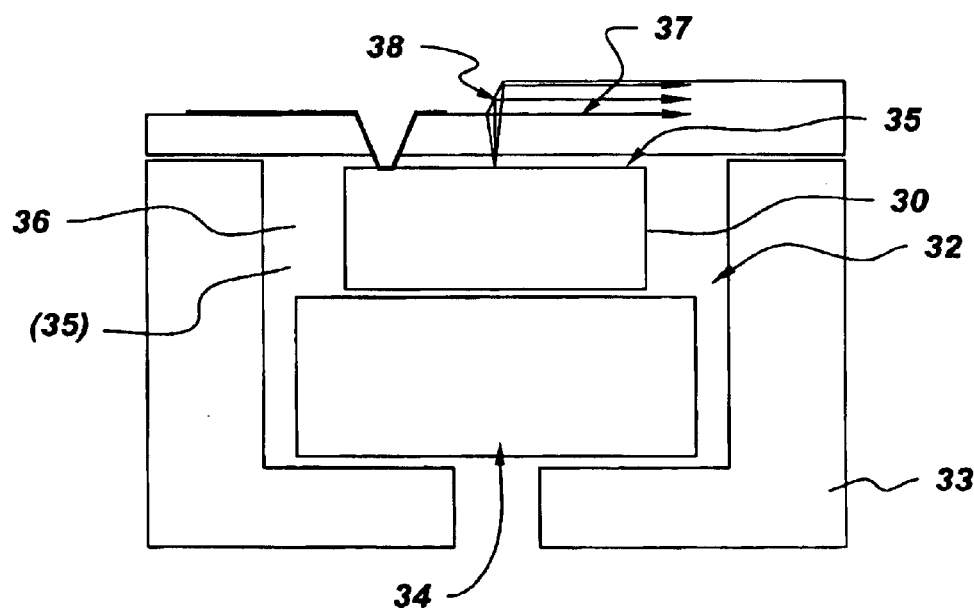
FIG. 2 shows a schematic diagram of a vertical cavity surface emitting laser device.

In another embodiment of the present invention, the encapsulating composition may be used with a vertical cavity surface emitting laser (VCSEL). A schematic diagram of the device is shown in FIG. 2. The VCSEL 30 may be embedded inside a pocket 32 of a printed circuit board assembly 33. A heat sink 34 maybe placed in the pocket 32 of the printed circuit board 33 and the VCSEL 30 may rest on the heat sink 34. The encapsulant composition 36 of the invention may be injected into the cavity 35 of the pocket 32 in the printed circuit board 33 and may flow around the VCSEL and encapsulate it on all sides and also form a coating top film 36 on the surface of the VCSEL 30. The top coating film 36 protects the VCSEL 30 from damage and degradation and at the same time is inert to moisture and is transparent and polishable. The laser beams 37 emitting from the VCSEL may strike the mirrors 38 to be reflected out of the pocket 32 of the printed circuit board 33.

Figure 3:
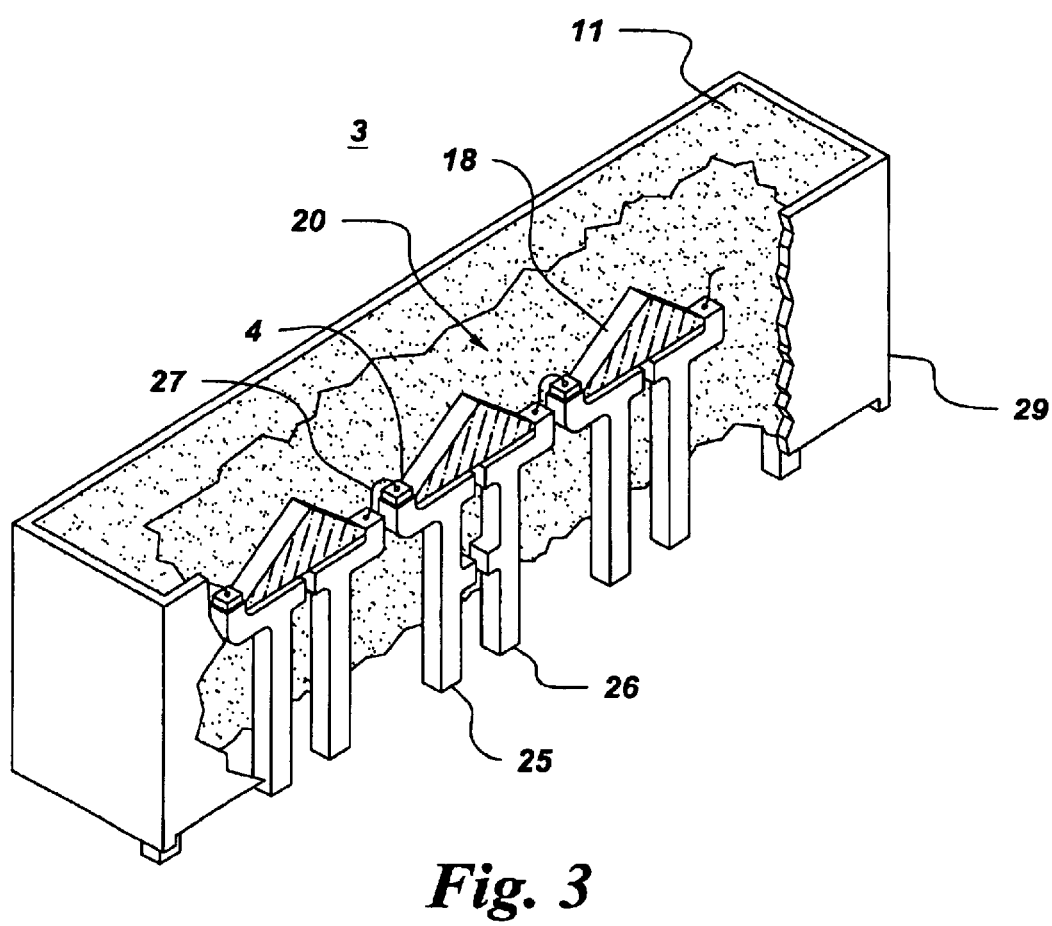
FIG. 3 shows a schematic diagram of an LED array on a plastic substrate.

In another embodiment of the present invention, a LED array 3 may be fabricated on a plastic substrate, as illustrated in FIG. 3. The LED chips or die 4 are physically and electrically mounted on cathode leads 26. The top surfaces of the LED chips 4 are electrically connected to anode leads 25 with lead wires 27. The lead wires may be attached by known wire bonding techniques to a conductive chip pad. The leads 26, 25 comprise a lead frame and may be made of a metal, such as silver plated copper. The lead frame and LED chip array 3 are contained in a plastic package 29, such as, for example, a polycarbonate package, a polyvinyl chloride package or a polyetherimide package. In some embodiments the polycarbonate comprises a bisphenol A polycarbonate. The plastic package 29 is filled with an encapsulant 11 of the present invention. The package 29 contains tapered interior sidewalls 18, which enclose the LED chips 4, and form a light spreading cavity 20, which ensures cross fluxing of LED light.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

EXAMPLE 1

The following procedure was used to make Sample 1 shown in Table 1. Into a small jar was placed 11.4 grams Z6018, (phenyl propyl hydroxy silicone from Dow Chemicals), 7.5 grams hexahydro-phthalic-anhydride (HHPA) (Ciba Geigy) and 0.4 grams SF1488 (polydimethylsiloxane surfactant from General Electric Co.). A cap was placed onto the jar and the contents heated using a microwave oven to a temperature of approximately 80° C. and mixed until all components were completely dissolved. After dissolution was complete, the sample was cooled to below 50° C., and 15 grams CY179, (cycloaliphatic epoxy resin from Ciba Geigy), 0.1 grams Irganox 1010 (antioxidant from Ciba) and 0.3 grams Tin ethyl-hexanoate were added. The material was blended and filtered through a nominal 5 micron pore sized filter into a clean jar. After filtration, the epoxy blend was degassed by placing it in a vacuum oven set at less than 60° C. for approximately 30 minutes while vacuum was applied. Once degassed the material was used to encapsulate components. A sample disk of the material was prepared by pouring the blend into an aluminum dish, covering it and curing the epoxy for 1 hour at 80° C., ramping to 180° C. over 1 hour, and holding at temperature for 2 hours. Other epoxy resin encapsulants were prepared using the procedure for Sample 1 by combining the various epoxy and silicone comprising resins, curing agents and other components and curing under the specified conditions as shown in Table 1. All quantities are in grams. While samples 1-3 were vacuum degassed and cured for 1 hour at 140° C. giving clear hard and transparent samples, samples 4, 5, 6 and 7 were filtered degassed and baked for 70 minutes at 150° C. to give clear light orange samples. Sample 8 was degassed for 2 hours at 175–180° C. to give a clear light orange sample. All samples were polishable and did not crack due to shock.

TABLE 1

| Epoxy cure studies | Sample 1 | Sample 2 | Sample 3 | Sample 4 | Sample 5 | Sample 6 | Sample 7 | Sample 8 |
|---|---|---|---|---|---|---|---|---|
| CY 179 | 15.00 | 5.00 | | | | | | 21.00 |
| Epon 862, Bis F Epoxy | | | | | 10.00 | | | |
| Shell Eponex 1510 | | | | | | 24.00 | 10.75 | |
| Araldite AY 238 | | | | 7.60 | | | | |
| Silikoftal ED | | 5.10 | 10.80 | 5.50 | 5.00 | | 10.80 | |

TABLE 1-continued

| Epoxy cure studies | Sample 1 | Sample 2 | Sample 3 | Sample 4 | Sample 5 | Sample 6 | Sample 7 | Sample 8 |
|---|---|---|---|---|---|---|---|---|
| Z6018 | 11.40 | 5.60 | 5.09 | 4.50 | 5.00 | 14.60 |  | 13.00 |
| HHPA | 7.50 | 4.50 | 2.09 | 6.60 | 6.00 | 14.40 | 10.00 | 11.00 |
| Epicuron B-4400 dianhydride |  |  |  |  |  |  |  | 3.00 |
| Sn Octoate | 0.30 | 0.20 | 0.11 | 0.27 | 0.25 | 0.60 | 0.20 |  |
| Ciba Irganox 1010 | 0.10 | 0.10 | 0.10 | 0.11 | 0.13 | 0.29 | 0.10 | 0.15 |
| SF 1488 | 0.40 | 0.30 | 0.25 | 0.55 | 0.50 | 0.70 | 0.27 | 0.5 |
| Final sample thickness/mils | 158 | 161 | 143 | 230 | 253 | 258 | 275 | 258 |
| Silicone component % | 33 | 52 | 88 | 40 | 38 | 27 | 34 | 27 |
| Tg/° C. | 140 | 87 | 24 | 92 | 64 | 64 | 55 | 148 |

Encapsulant compositions used in the invention are shown in Table-2.

TABLE-2

| Component, % wt | Material type | One component % | HHPA B-4400 | Optional items | Surfactant |
|---|---|---|---|---|---|
| CY 179 | Epoxy | 0–50% |  |  |  |
| Epon 882 BisF Epoxy | Epoxy | 0–50% |  |  |  |
| Shell Eponex 1510 | Epoxy | 0–50% |  |  |  |
| Araldite AY 238 | Epoxy | 0–50% |  |  |  |
| Silkoftal EDZ6018 | Silicone epoxy | 0–70% |  |  |  |
| HHPA | Anhydride Hardener |  | 5–50% |  |  |
| Epiclon B 4400 Dianhydride | Anhydride hardener |  | 0–10% |  |  |
| Sn Octoate | Accelaration catlyst |  | 0.5% |  |  |
| Ciba Irganox 1010 | Antioxidant |  | 0–5 |  |  |
| SF 1488 | Silicone surfactant |  |  |  | 0.5–10% |
| Ciba Tinuvin | UV absorber |  | 0–5 |  |  |
| Z 6018 | Silicone resin | 1–50 |  |  |  |

Figure 4:
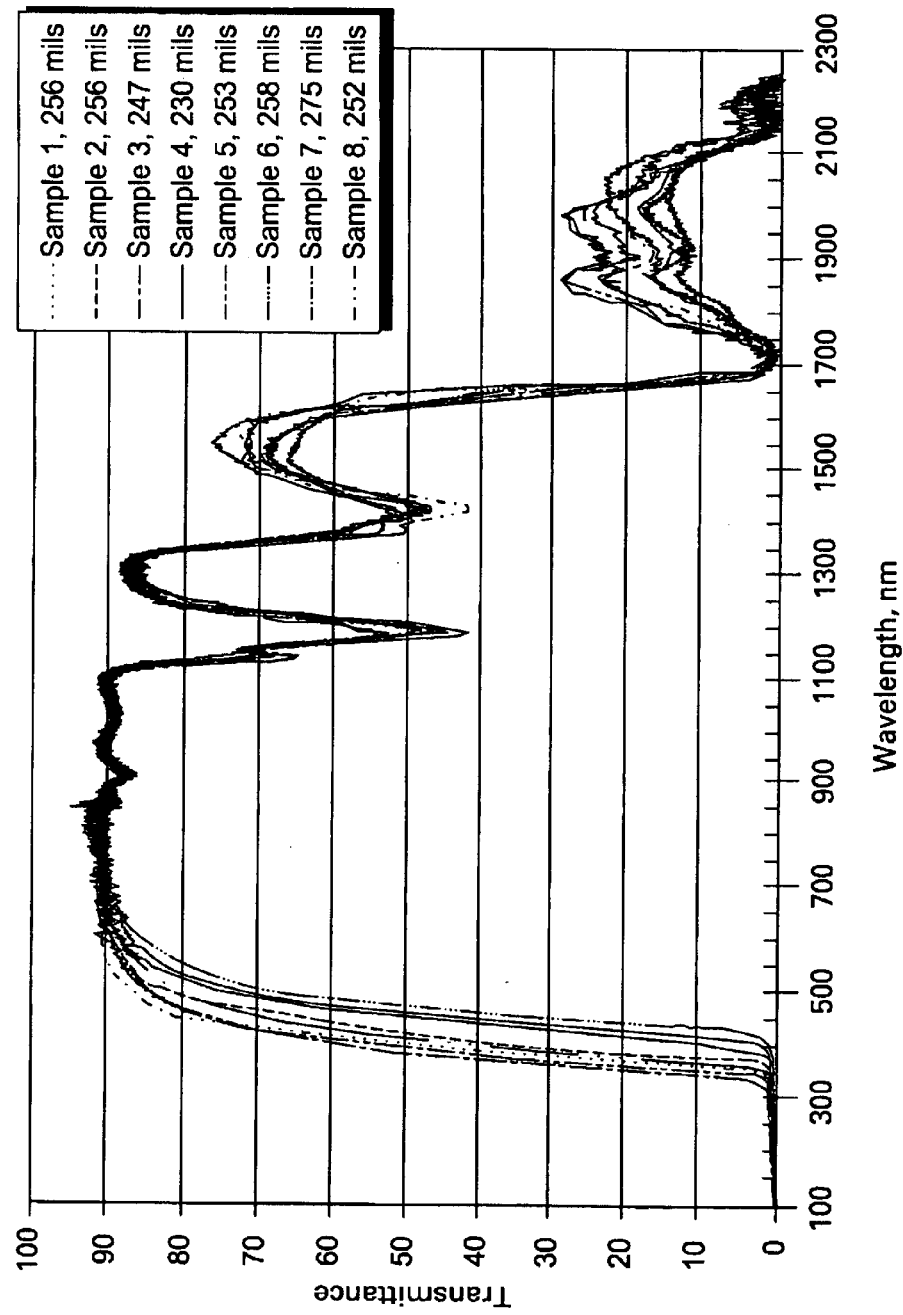
FIG. 4 shows UV-VIS-Near IR transmission data for silicone containing epoxy blends.

UV-Vis-Near IR Transmission spectrum for silicone containing epoxy blends with siloxane surfactants is shown in FIG. 4 for compositions described in Tables 1 and 2. The spectra indicate transmission in a range between about 500 nm and about 1100 nm.

Figure 5:
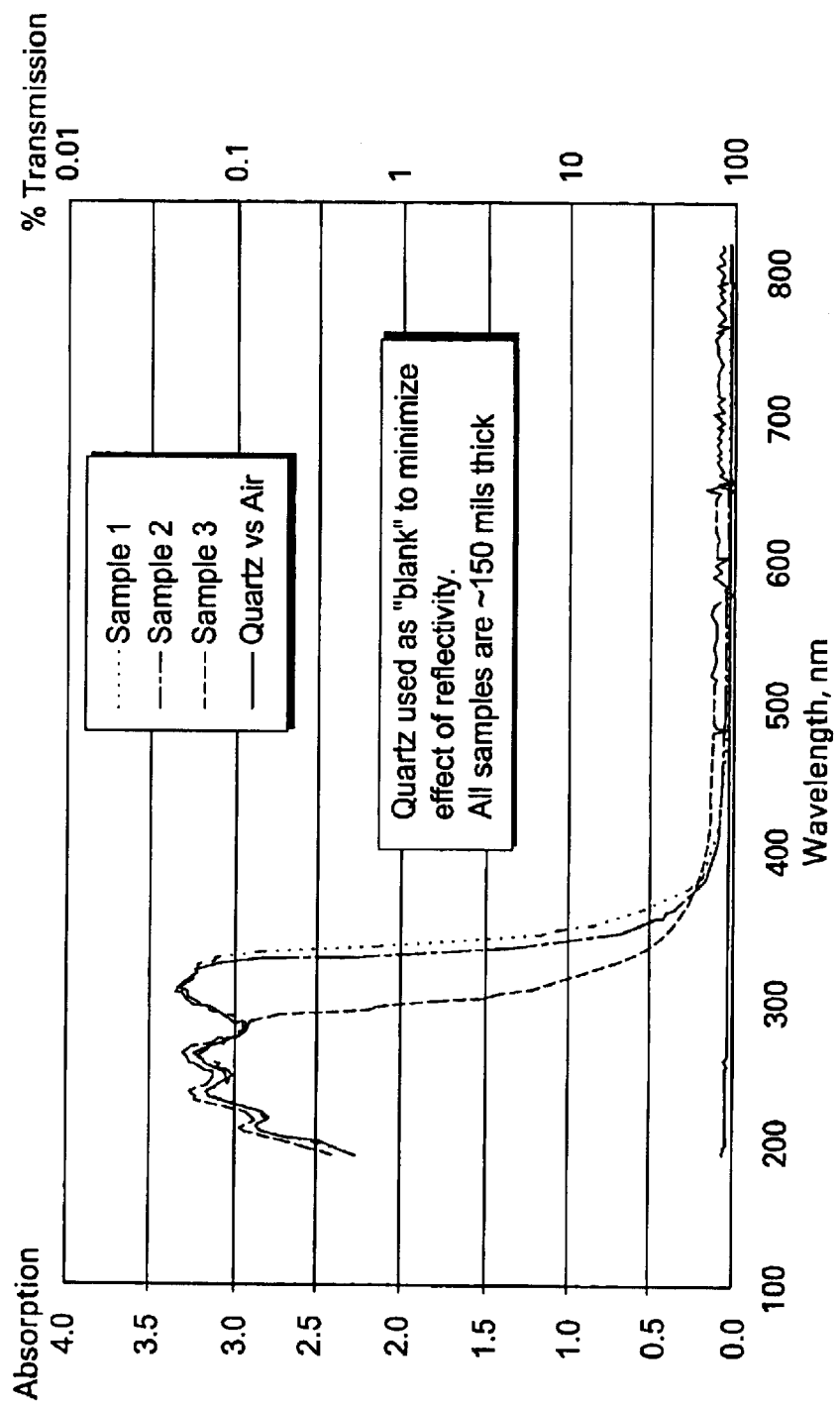
FIG. 5 shows UV-VIS absorption spectra for silicone containing epoxy blends.

FIG. 5 shows UV-Vis absorption spectra for silicone containing epoxy blends. (The compositions are given in Tables 1 and 2.) No absorptions are seen beyond 500 nm.

Figure 6:
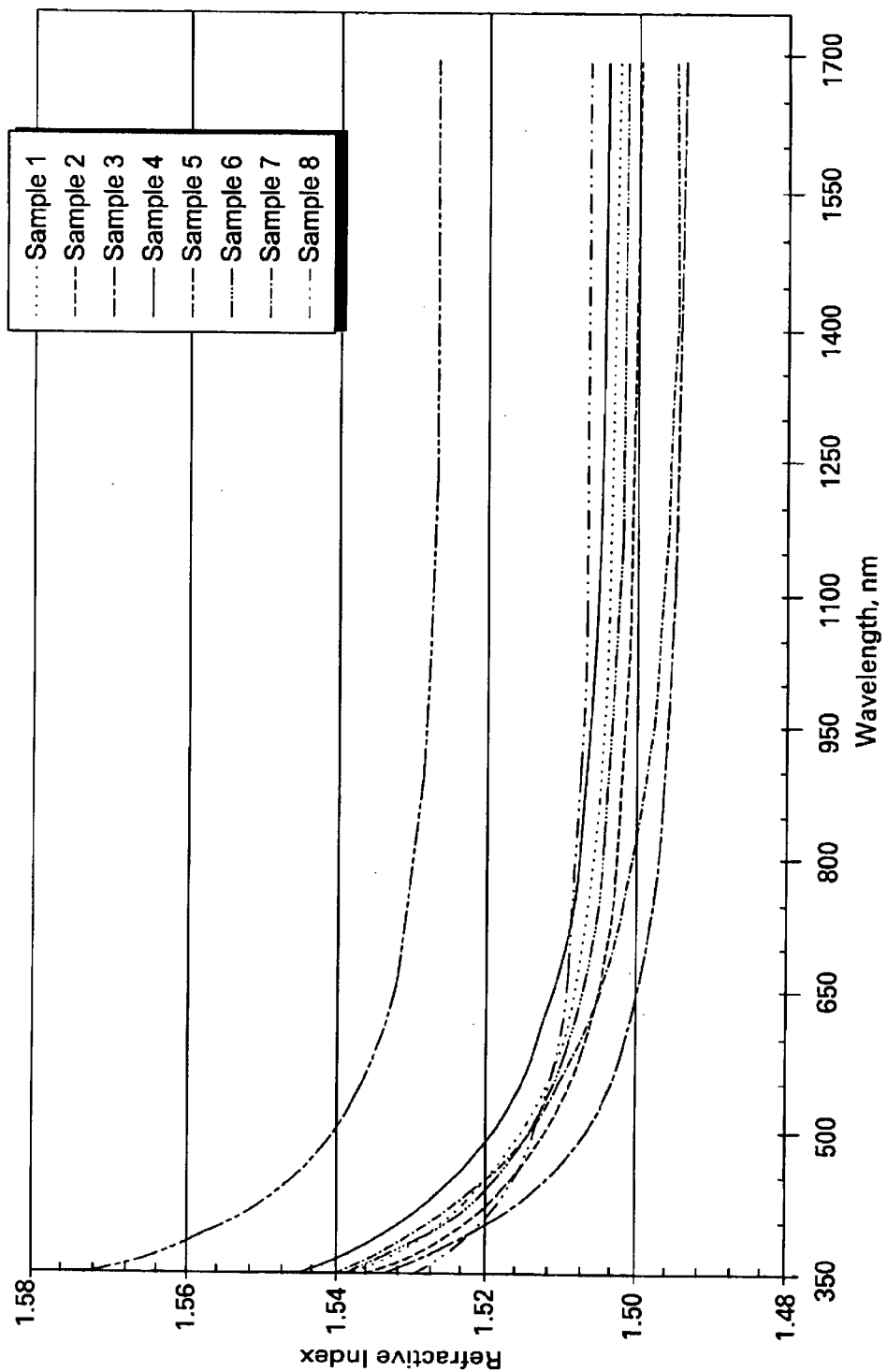
FIG. 6 shows refractive index against wavelength data for silicone containing epoxy blends.

Refractive index against wavelength data for silicone epoxy blends is shown in FIG. 6 for compositions given in Tables 1 and 2. Refractive index values decreased from 1.58 at 350 nm to about 1.49 at 1700 nm.

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims.

What is claimed is:

1. A curable epoxy resin composition for encapsulation of a solid state device, which comprises (A) at least one silicone resin, (B) at least one epoxy resin, (C) at least one anhydride curing agent, (D) at least one siloxane surfactant, and (E) at least one ancillary curing catalyst; wherein the silicone resin comprises a silicone resin of structure (I)

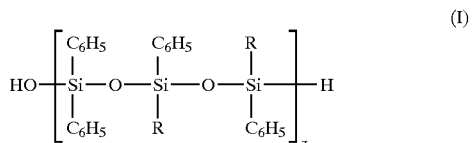

(I)

wherein R is independently at each occurrence a hydroxyl group, $C_{1-22}$ alkyl, $C_{1-22}$ alkoxy, $C_{2-22}$ alkenyl, $C_{6-14}$ aryl, $C_{6-22}$ alkyl-substituted aryl, $C_{6-22}$ aralkyl, or $OSiR^3$ wherein $R^3$ is independently at each occurrence hydroxyl, $C_{1-22}$ alkyl, $C_{1-22}$ alkoxy, $C_{2-22}$ alkenyl, $C_{6-14}$ aryl, $C_{6-22}$ alkyl-substituted aryl, or $C_{6-22}$ aralkyl; and wherein z is in a range between about 1 and about 10.

2. The composition of claim 1, wherein the epoxy resin is selected from the group consisting of aliphatic epoxy resins, cycloaliphatic epoxy resins, bisphenol-A epoxy resins, bisphenol-F epoxy resins, phenol novolac epoxy resins, cresol-novolac epoxy resins, biphenyl epoxy resins, biphenyl epoxy resins, 4,4'-biphenyl epoxy resins, polyfunctional epoxy resins, divinylbenzene dioxide, 2-glycidylphenylglycidyl ether, and combinations thereof.

3. The composition of claim 1, wherein the epoxy resin is selected from the group consisting of epoxy resins in structures (II) to (V)

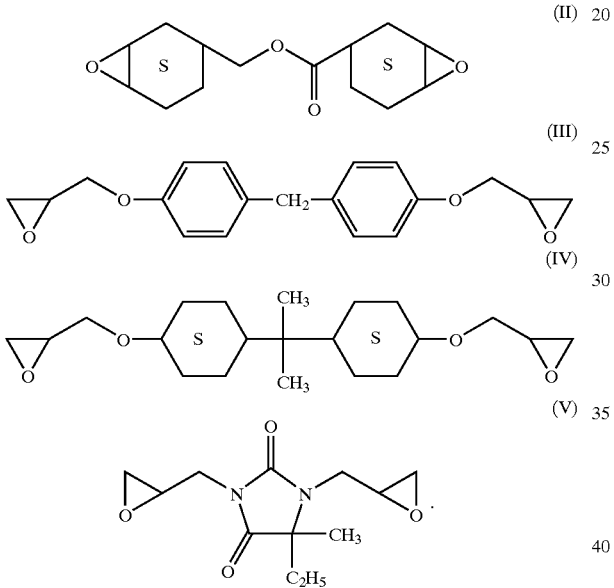

4. The composition of claim 1, wherein the anhydride curing agent is selected from the group consisting of bicyclo[2.2.1]hept-5-ene-2,3-dicarboxylic anhydride, methylbicyclo[2.2.1]hept-5-ene-2,3-dicarboxylic anhydride, bicyclo[2.2.1]hept-5-ene-2,3-dicarboxylic anhydride, phthalic anhydride, pyromellitic dianhydride, hexahydrophthalic anhydride, hexahydro-4-methylphthalic anhydride, dodecenylsuccinic anhydride, dichloromaleic anhydride, chlorendic anhydride, tetrachlorophthalic anhydride, and combinations thereof.

5. The composition of claim 1, wherein the anhydride curing agent is a compound of structure (VI), (VII), or combination thereof

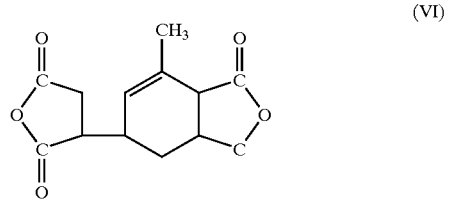

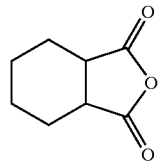

6. The composition of claim 1 wherein the siloxane surfactant is a compound of structure (VIII), (IX), or combination thereof

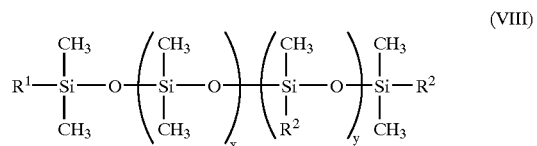

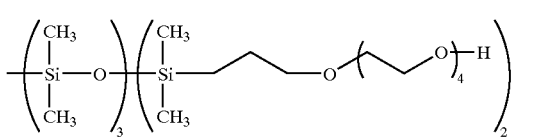

wherein $R^1$ and $R^2$ are independently at each occurrence selected from ethylene oxide, propylene oxide and methylene in structure (VIII) and where x and y are in a range between 0 and about 20 in structure (VIII).

7. The composition of claim 1, wherein the anhydride curing agent (C) is hexahydro-4-methylphthalic anhydride.

8. The composition of claim 1 further comprising refractive index modifiers selected from the group consisting of magnesium oxide, yttria, zirconia, cerium oxides, alumina, lead oxides, zinc selenide, zinc sulphides, alloys made from Zn, Se, S, and Te, gallium nitride, silicon nitride, aluminum nitride, and combinations thereof.

9. The composition of claim 1, wherein the composition is cured in a range between about 100° C. and about 200° C.

10. The composition of claim 1, wherein the ancillary curing catalyst (E) is selected from the group consisting of an organometallic salt, a sulfonium salt, an iodonium salt, and combinations thereof.

11. The composition of claim 1, wherein the ancillary curing catalyst (E) is selected from the group consisting of a metal carboxylate, a metal acetylacetonate, zinc octoate, stannous octoate, triarylsulfonium hexafluorophosphate, triarylsulfonium hexafluoroantimonate, diaryliodonium hexafluoroantimonate, diaryliodoniun tetrakis (pentafluorophenyl)borate, and combinations thereof.

12. The composition of claim 11, wherein the ancillary curing catalyst (E) comprises zinc octoate.

13. The composition of claim 1, comprising at least one of a hindered phenol stabilizer, a phosphite stabilizer, or combinations thereof.

14. The composition of claim 1 wherein the refractive index of the composition is in a range between about 0.1 and about 10.0.

15. The composition of claim 1 wherein the composition is clear, transparent, polishable and crackfree.

16. A curable epoxy resin composition for encapsulation of a solid state device, which comprises (A) a silicone resin comprising a hydroxyfunctional silicone resin, (B) an epoxy resin comprising bisphenol A epoxy resin, (C) an anhydride curing agent comprising hexahydro-4-methylphthalic anhydride, (D) a siloxane surfactant comprising ethylene oxide functionalized siloxane, and (E) an ancillary curing catalyst zinc octoate, wherein component (A) is present at a level of greater than about 40% by weight; component (B) is present at a level in a range of between about 1% by weight and about 20% by weight; component (C) is present at a level of less than about 40% by weight; and component (D) and (E) are present at a level in a range between about 0.008% by weight and about 10% by weight based on the combined weight of silicone resin (A), epoxy resin (B), anhydride curing agent (C), siloxane surfactant (D) and ancillary curing catalyst (E).

17. The composition of claim 16 further comprising at least one of a thermal stabilizer, a UV stabilizer, or combinations thereof.

18. The composition of claim 16 wherein the composition has a glass transition temperature varying in a range between about 24° C. and about 150° C.

19. The composition of claim 16 wherein the composition has a refractive index in a range between about 0.1 and about 10.0.

20. A packaged solid state device comprising: (a) a package; a chip; and (c) an encapsulant comprising: (A) at least one silicone resin, (B) at least one epoxy resin, (C) at least one anhydride curing agent, (D) at least one siloxane surfactant, and (E) at least one ancillary curing catalyst, wherein the silicone resin comprises a silicone resin selected from the silicone resin in structure (I)

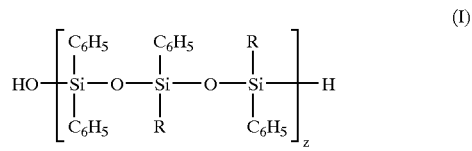

wherein R is independently at each occurrence a hydroxyl group, $C_{1-22}$ alkyl, $C_{1-22}$ alkoxy, $C_{2-22}$ alkenyl, $C_{6-14}$ aryl, $C_{6-22}$ alkyl-substituted aryl, $C_{6-22}$ aralkyl, or $OSiR^3$ wherein $R^3$ is independently at each occurrence hydroxyl, $C_{1-22}$ alkyl, $C_{1-22}$ alkoxy, $C_{2-22}$ alkenyl, $C_{6-14}$ aryl, $C_{6-22}$ alkyl-substituted aryl, or $C_{6-22}$ aralkyl; and wherein z is in a range between about 1 and about 10.

21. The packaged solid state device of claim 20, wherein the solid state device is a semiconductor device.

22. A packaged solid state device, wherein the solid state device is an opto-electronic device, comprising: (a) a package; a chip; and (c) an encapsulant comprising: (A) at least one silicone resin, (B) at least one epoxy resin, (C) at least one anhydride curing agent, (D) at least one siloxane surfactant, and (E) at least one ancillary curing catalyst.

23. The packaged solid state device of claim 22, wherein the opto-electronic device is semiconductor device comprising: a LED, CCD, LSI, photodiode, phototransistor, or opto-electronic coupler.

24. The packaged solid state device of claim 20, wherein the package comprises a shell or lens.

25. The packaged solid state device of claim 20, wherein the epoxy resin is selected from the group consisting of aliphatic epoxy resins, cycloaliphatic epoxy resins, bisphenol-A epoxy resins, bisphenol-F epoxy resins, phenol novolac epoxy resins, cresol-novolac epoxy resins, biphenyl epoxy resins, biphenyl epoxy resins, 4,4'-biphenyl epoxy resins, polyfunctional epoxy resins, divinylbenzene dioxide, 2-glycidylphenylglycidyl ether, and combinations thereof.

26. The packaged solid state device of claim 20, wherein the epoxy resin is a resin selected from the structures (II) to (V)

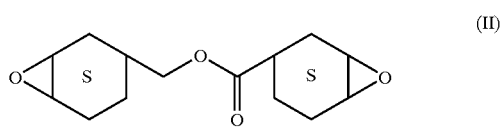

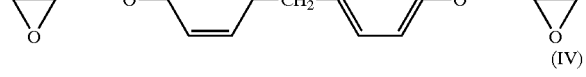

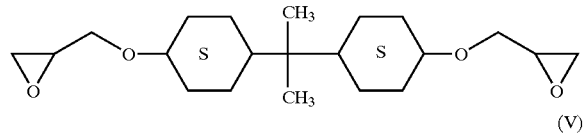

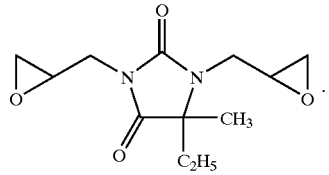

27. The packaged solid state device of claim 20, wherein the anhydride curing agent is selected from the group consisting of bicyclo[2.2.1]hept-5-ene-2,3-dicarboxylic anhydride, methylbicyclo[2.2.1]hept-5-ene-2,3-dicarboxylic anhydride, bicyclo[2.2.1]hept-5-ene-2,3-dicarboxylic anhydride, phthalic anhydride, pyromellitic dianhydride, hexahydrophthalic anhydride, hexahydro-4-methylphthalic anhydride, dodecenylsuccinic anhydride, dichloromaleic anhydride, chlorendic anhydride, tetrachlorophthalic anhydride, and combinations thereof.

28. The packaged solid state device of claim 20, wherein the anhydride curing agent (C) is a compound of structure (VI), (VII), or combination thereof

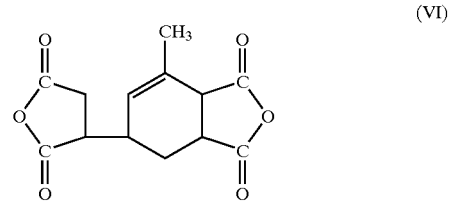

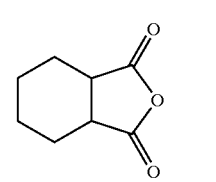

29. The packaged solid state device of claim 20 wherein the anhydride curing agent (C) comprises hexahydro-4-methylphthalic anhydride.

30. The packaged solid state device of claim 20 wherein the siloxane surfactant is a compound of structure (VIII), (IX), or combination thereof $$R^1-\underset{\underset{CH_3}{|}}{\overset{\overset{CH_3}{|}}{Si}}-O-\left(\underset{\underset{CH_3}{|}}{\overset{\overset{CH_3}{|}}{Si}}-O\right)_x-\left(\underset{\underset{R^2}{|}}{\overset{\overset{CH_3}{|}}{Si}}-O\right)_y-\underset{\underset{CH_3}{|}}{\overset{\overset{CH_3}{|}}{Si}}-R^2 \quad \text{(VIII)}$$

$$\left(\underset{\underset{CH_3}{|}}{\overset{\overset{CH_3}{|}}{Si}}-O\right)_3-\left(\underset{\underset{CH_3}{|}}{\overset{\overset{CH_3}{|}}{Si}}-\phantom{x}-O-\phantom{x}-O\right)_4-H\right)_2 \quad \text{(IX)}$$

wherein $R^1$ and $R^2$ are independently at each occurrence selected from methylene, ethylene oxide and propylene oxide in structure (VIII) and wherein x and y are in a range between 0 and about 20 in structure (VIII).

31. The packaged solid state device of claim 20, wherein the ancillary curing catalyst (E) is selected from the group consisting of an organometallic salt, a sulfonium salt, an iodonium salt, and combinations thereof.

32. The packaged solid state device of claim 20, wherein the ancillary curing catalyst (E) comprises at least one member selected from the group consisting of a metal carboxylate, a metal acetylacetonate, zinc octoate, stannous octoate, triarylsulfonium hexafluorophosphate, triarylsulfonium hexafluoroantimonate, diaryliodonium hexafluoroantimonate, diaryliodonium tetrakis (pentafluorophenyl)borate, and combinations thereof.

33. The packaged solid state device of claim 20, wherein the ancillary curing catalyst (E) is zinc octoate.

34. The packaged solid state device of claim 20, further comprising at least one of thermal stabilizers, UV stabilizers, cure modifiers, coupling agents, refractive index modifiers, or combinations thereof.

35. The packaged solid state device of claim 20, comprising at least one of a thermal stabilizer, a UV stabilizer, or combinations thereof.

36. The packaged solid state device of claim 20 wherein the encapsulant is clear, transparent, crackfree and polishable.

37. The packaged solid state device of claim 20 wherein the encapsulant has a glass transition varying in a range between about 24° C. and about 150° C.

38. The packaged solid state device of claim 21 wherein the encapsulant has a refractive index in a range between about 0.1 and about 10.0.

39. A LED device comprising: (a) a package; a LED chip; and (c) an encapsulant comprising: (A) a silicone resin comprising a hydroxyfunctional silicone resin, (B) an epoxy resin comprising a bisphenol F resin, (C) an anhydride curing agent comprising hexahydro-4-methylphthalic anhydride, (D) a siloxane surfactant comprising propylene oxide modified siloxane, and (E) a ancillary curing catalyst comprising zinc octoate, wherein component (A) is present at a level of greater than about 40% by weight; component (B) is present at a level in a range of between about 1% by weight and about 20% by weight; component (C) is present at a level of less than about 40% by weight; and component (D) and (E) are present at a level in a range between about 0.008% by weight and about 10% by weight based on the combined weight of silicone resin (A), epoxy resin (B), a siloxane surfactant (D) anhydride curing agent (C), and ancillary curing catalyst (E).

40. The LED of claim 39, in which the encapsulant further comprises at least one of a thermal stabilizer, a UV stabilizer, or combination thereof.

41. The LED of claim 39, in which the encapsulant has a glass transition temperature varying in a range between about 24° C. and about 150° C.

42. The LED of claim 39 in which the encapsulant has a refractive index in a range between about 0.1 and about 10.0.

43. A method of encapsulating a solid state device comprising: placing a solid state device into a package; and providing an encapsulant comprising: (A) at least one silicone resin, (B) at least one epoxy resin (C) at least one anhydride curing agent (D) at least one siloxane surfactant, and (E) at least one ancillary curing catalyst, wherein the silicone resin (A) comprises a silicone resin of structure (I)

$$HO-\left[\underset{\underset{C_6H_5}{|}}{\overset{\overset{C_6H_5}{|}}{Si}}-O-\underset{\underset{R}{|}}{\overset{\overset{C_6H_5}{|}}{Si}}-O-\underset{\underset{C_6H_5}{|}}{\overset{\overset{R}{|}}{Si}}\right]_z-H \quad \text{(I)}$$

wherein R is independently at each occurrence a hydroxyl group, $C_{1-22}$ alkyl, $C_{1-22}$ alkoxy, $C_{2-22}$ alkenyl, $C_{6-14}$ aryl, $C_{6-22}$ alkyl-substituted aryl, $C_{6-22}$ aralkyl, or $OSiR^3$ wherein $R^3$ is independently at each occurrence hydroxyl, $C_{1-22}$ alkyl, $C_{1-22}$ alkoxy, $C_{2-22}$ alkenyl, $C_{6-14}$ aryl, $C_{6-22}$ alkyl-substituted aryl, or $C_{6-22}$ aralkyl; and wherein z is in a range between about 1 and about 10.

44. The method of claim 43, wherein the solid state device is a semiconductor device.

45. The method of claim 43, wherein the solid state device is an opto-electronic device.

46. The method of claim 45, wherein the opto-electronic device is semiconductor device comprising: a LED, CCD, LSI, photodiode, phototransistor, or opto-electronic coupler.

47. The method of claim 43, wherein the package comprises a shell or lens.

48. The method of claim 43, wherein the epoxy resin is selected from the group consisting of aliphatic epoxy resins, cycloaliphatic epoxy resins, bisphenol-A epoxy resins, bisphenol-F epoxy resins, phenol novolac epoxy resins, cresol-novolac epoxy resins, biphenyl epoxy resins, biphenyl epoxy resins, 4,4'-biphenyl epoxy resins, polyfunctional epoxy resins, divinylbenzene dioxide, 2-glycidylphenylglycidyl ether, and combinations thereof.

49. The method of claim 43, wherein the epoxy resin is a resin selected from structures (II) to (V)

-continued (V)
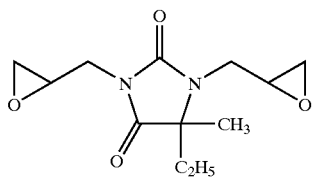

50. The method of claim 43, wherein the anhydride curing agent (C) is selected from the group consisting of bicyclo[2.2.1]hept-5-ene-2,3-dicarboxylic anhydride, methylbicyclo[2.2.1]hept-5-ene-2,3-dicarboxylic anhydride, bicyclo[2.2.1]hept-5-ene-2,3-dicarboxylic anhydride, phthalic anhydride, pyromellitic dianhydride, hexahydrophthalic anhydride, hexahydro-4-methylphthalic anhydride, dodecenylsuccinic anhydride, dichloromaleic anhydride, chlorendic anhydride, tetrachlorophthalic anhydride, and combinations thereof.

51. The method of claim 43, wherein the anhydride curing agent is a compound of structure (VI), (VII), or combination thereof (VI)
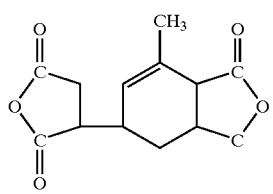

(VII)
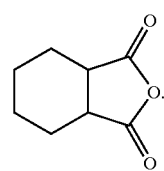

52. The method of claim 43, wherein the siloxane surfactant (D) is a compound of structure (VIII), (IX), or combination thereof (VIII)
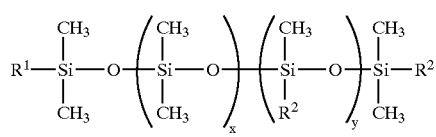

(IX)
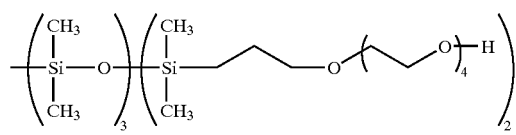

wherein $R^1$ and $R^2$ are independently at each occurrence selected from methylene, ethylene oxide and propylene oxide and in structure (VIII) wherein x and y are in a range between 0 and about 20 in structure (VIII).

53. The method of claim 43, wherein siloxane surfactant (D) comprises an ethyleneoxide functionalized siloxane.

54. The method of claim 43, wherein the anhydride curing agent (C) comprises hexahydro-4-methylphthalic anhydride.

55. The method of claim 43, wherein the ancillary curing catalyst (E) is selected from the group consisting of an organometallic salt, a sulfonium salt, an iodonium salt, and combinations thereof.

56. The method of claim 43, wherein the ancillary curing catalyst (E) is selected from the group consisting of a metal carboxylate, a metal acetylacetonate, zinc octoate, stannous octoate, triarylsulfonium hexafluorophosphate, triarylsulfonium hexafluoroantimonate, diaryliodonium hexafluoroantimonate, diaryliodonium tetrakis (pentafluorophenyl)borate, and combinations thereof.

57. The method of claim 43, wherein the ancillary curing catalyst is zinc octoate.

58. The method of claim 43, further comprising at least one of thermal stabilizers, UV stabilizers, cure modifiers, coupling agents, refractive index modifiers, or combinations thereof.

59. The method of claim 43, comprising at least one of a thermal stabilizer, a UV stabilizer, or combination thereof.

60. The method of claim 43, wherein the encapsulant is clear, transparent, crackfree and polishable.

61. The method of claim 43, wherein the encapsulant has a glass transition temperature varying in a range between about 24° C. and about 150° C.

62. The method of claim 43, wherein the encapsulant has a refractive index in a range between about 0.1 and about 10.0.

63. A method of encapsulating a LED device comprising: placing a LED device into a package and providing an encapsulant comprising: (A) a silicone resin comprising hydroxyfunctionalized silicone, (B) an epoxy resin comprising bisphenol F, (C) an anhydride curing agent comprising hexahydro-4-methylphthalic anhydride, (D) a siloxane surfactant comprising ethylene oxide functionalized siloxane, and (E) an ancillary curing catalyst comprising zinc octoate, wherein component (A) is present at a level of greater than about 40% by weight; component (B) is present at a level in a range of between about 1% by weight and about 20% by weight; component (C) is present at a level of less than about 40% by weight; and component (D) and (E) are present at a level in a range between about 0.008% by weight and about 10% by weight based on the combined weight of the silicone resin (A), epoxy resin (B), siloxane surfactant (C), curing agent (D), and ancillary curing catalyst (E).

64. The method of claim 63, wherein the encapsulant further comprises at least one of a thermal stabilizer, a UV stabilizer, or combination thereof.

65. The method of claim 63, wherein the encapsulant is partially cured.

66. The method of claim 63, wherein the encapsulant is cured.

* * * * *

UNITED STATES PATENT AND TRADEMARK OFFICE
CERTIFICATE OF CORRECTION

PATENT NO. : 6,800,373 B2  
APPLICATION NO. : 10/265422  
DATED : October 5, 2004  
INVENTOR(S) : Thomas Bert Gorczyca Page 1 of 1

It is certified that error appears in the above-identified patent and that said Letters Patent is hereby corrected as shown below:

Please make the following corrections to the above-identified patent:

Col. 15, line 11  
Claim 2, delete "biphenyl epoxy resins".

Col. 17, line 21  
Claim 20, insert -- (b)-- before "a chip"

Col. 17, line 47  
Claim 22, insert -- (b) -- before "a chip"

Col. 17, line 62  
Claim 25, delete " biphenyl epoxy resins".

Col. 19, line 37  
Claim 35, delete "a" before "thermal".

Col. 19, line 37  
Claim 35, delete "a" (second occurrence) before "UV".

Col. 19, line 48  
Claim 39, insert -- (b) -- before "a LED chip".

Col. 20, line 46  
Claim 48, delete "biphenyl epoxy resins".

Signed and Sealed this

Twentieth Day of March, 2007

JON W. DUDAS  
*Director of the United States Patent and Trademark Office*